(12) United States Patent
Chen et al.

(10) Patent No.: US 10,283,424 B1
(45) Date of Patent: May 7, 2019

(54) WAFER STRUCTURE AND PACKAGING METHOD

(71) Applicant: Taiwan Semiconductor Manufacturing Co., Ltd., Hsinchu (TW)

(72) Inventors: Tsui-Mei Chen, Hsinchu (TW); Pei-Haw Tsao, Tai-chung (TW); Cheng-Te Lin, Hsinchu (TW); Yu-Jung Lin, Hsinchu (TW); Li-Huan Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/916,210

(22) Filed: Mar. 8, 2018

(51) Int. Cl.

| | | |
|---|---|---|
| *H01L 21/66* | (2006.01) | |
| *H01L 21/78* | (2006.01) | |
| *H01L 21/268* | (2006.01) | |
| *H01L 23/58* | (2006.01) | |
| *H01L 21/3213* | (2006.01) | |
| *H01L 21/263* | (2006.01) | |

(52) U.S. Cl.
CPC .............. *H01L 22/32* (2013.01); *H01L 21/78* (2013.01); *H01L 22/20* (2013.01); *H01L 21/268* (2013.01); *H01L 21/2633* (2013.01); *H01L 21/3213* (2013.01); *H01L 22/34* (2013.01); *H01L 23/585* (2013.01)

(58) Field of Classification Search
CPC ......... H01L 22/32; H01L 22/20; H01L 21/78; H01L 21/2633; H01L 21/3213; H01L 23/585; H01L 22/34; H01L 21/268
See application file for complete search history.

(56) References Cited

U.S. PATENT DOCUMENTS

| | | | | |
|---|---|---|---|---|
| 5,981,971 | A * | 11/1999 | Miyakawa | G01R 31/31719 257/48 |
| 7,906,836 | B2 * | 3/2011 | Chen | H01L 21/78 257/675 |
| 2004/0207078 | A1 * | 10/2004 | Su | H01L 22/34 257/723 |
| 2006/0022195 | A1 * | 2/2006 | Wang | H01L 22/32 257/48 |
| 2006/0223284 | A1 * | 10/2006 | Li | H01L 21/6835 438/463 |
| 2007/0275543 | A1 * | 11/2007 | Abe | H01L 21/78 438/464 |
| 2010/0072635 | A1 | 3/2010 | Kuo et al. | |
| 2010/0181650 | A1 * | 7/2010 | Shigihara | H01L 21/6836 257/620 |

(Continued)

*Primary Examiner* — Karen Kusumakar
(74) *Attorney, Agent, or Firm* — JCIPRNET

(57) ABSTRACT

Packaging method and wafer structures are described. A semiconductor wafer having dies, scribe streets surrounding the dies and between the dies and test pads in the scribe streets is provided. Wafer testing is performed to the semiconductor wafer through the test pads. A laser grooving process is performed to the semiconductor wafer along the scribe streets and the test pads in the scribe streets are removed to form laser scanned regions in the scribe streets. A mechanical dicing process is performed cutting through the semiconductor wafer along the scribe streets to singulate the dies. The singulated dies are packaged.

20 Claims, 10 Drawing Sheets

(56) References Cited

U.S. PATENT DOCUMENTS

| | | | |
|---|---|---|---|
| 2011/0156220 A1* | 6/2011 | Kogawa | H01L 21/304 |
| | | | 257/620 |
| 2012/0199565 A1* | 8/2012 | Nomaru | B23K 26/0626 |
| | | | 219/121.67 |
| 2013/0009656 A1* | 1/2013 | Wu | H01L 22/34 |
| | | | 324/755.01 |
| 2017/0141051 A1 | 5/2017 | Yu et al. | |
| 2017/0372963 A1* | 12/2017 | Huang | H01L 21/6835 |

* cited by examiner

WAFER STRUCTURE AND PACKAGING METHOD

BACKGROUND

Wafer level testing refers to the process of subjecting semiconductor devices in wafer form to electrical testing. Such testing technology is useful not only for testing wafer level packaged devices but also for testing semiconductor devices sold as bare dies or known good dies (KGD) for conventional packaging. Wafer testing methods utilize test pads located in the scribe street regions, and the test pads are electrically connected to an external terminal through probe needles during wafer testing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
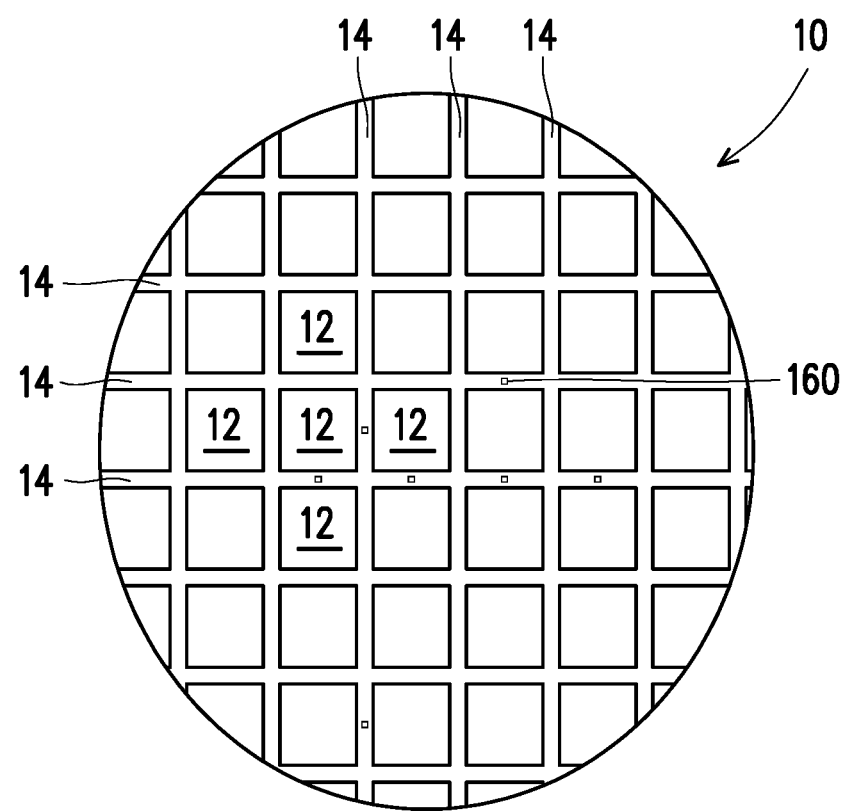
FIG. 1 is a schematic top view of an exemplary wafer structure with scribe streets in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Figure 2:
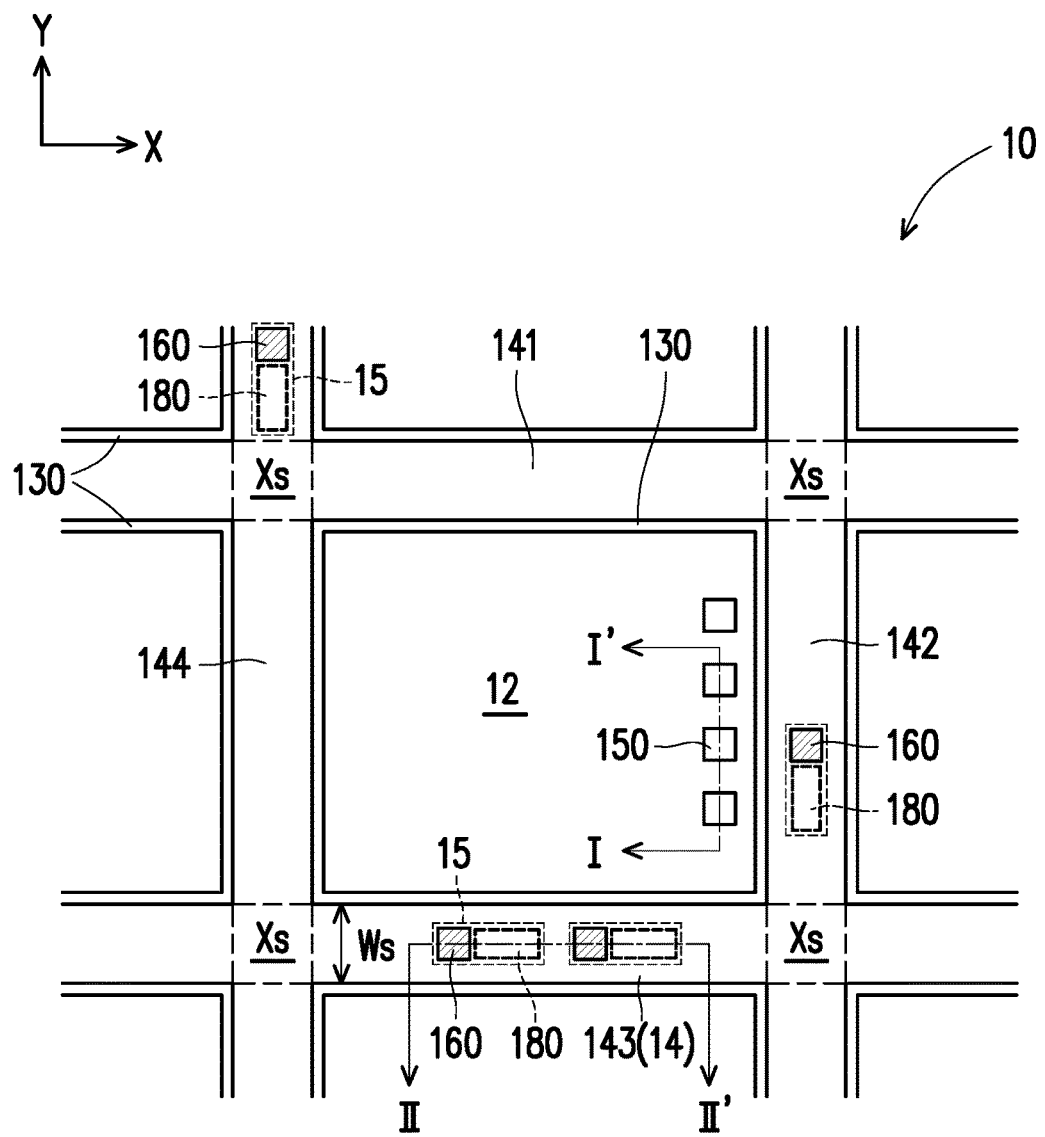
FIG. 2 is a schematic top view of a portion of the wafer structure in accordance with some embodiments of the present disclosure.
Figure 3A:
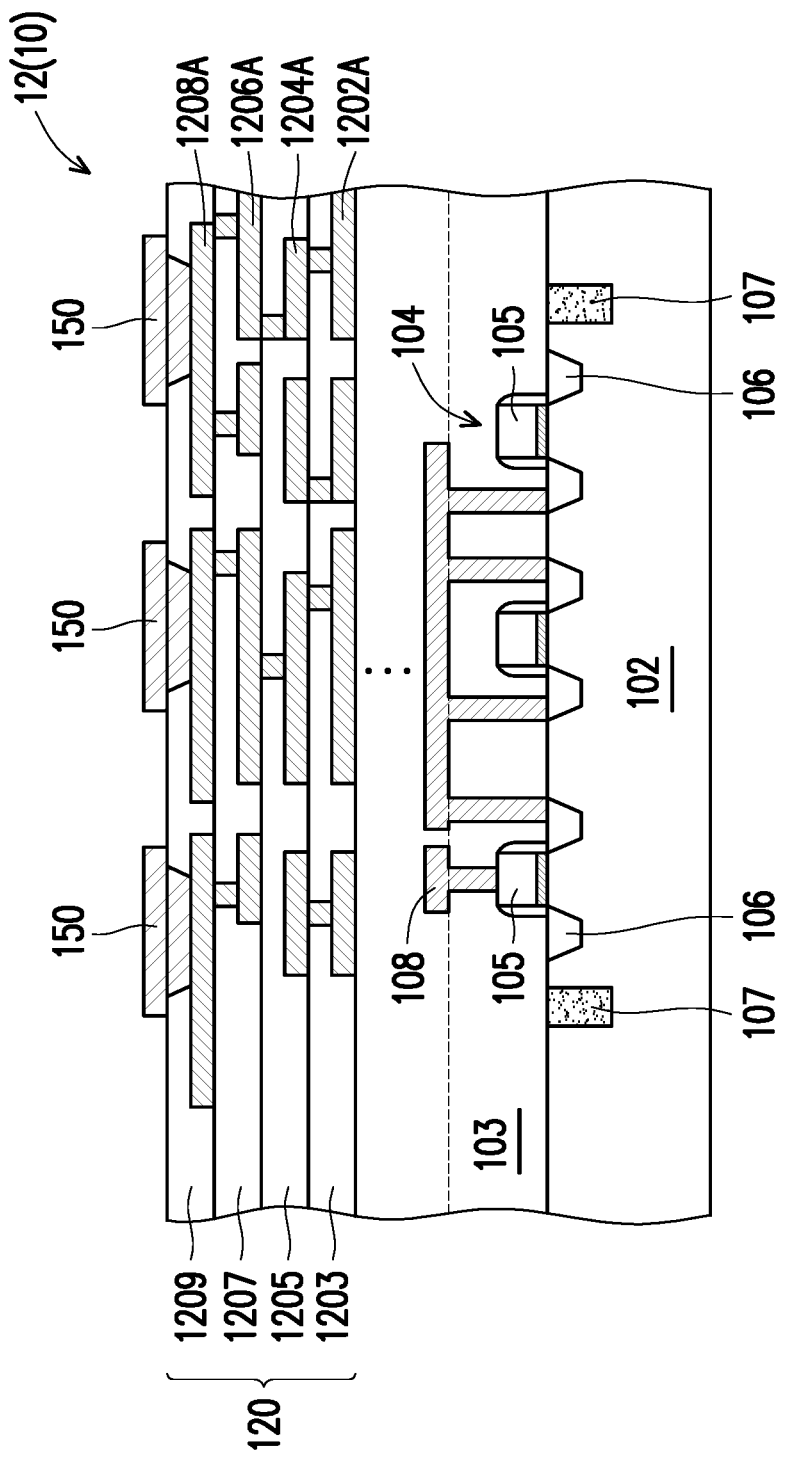
FIG. 3A & FIG. 3B are schematic cross-sectional views of portions of the wafer structure of FIG. 2 along the cross-sectional lines I-I' and II-II' in accordance with some embodiments of the present disclosure.
Figure 3B:
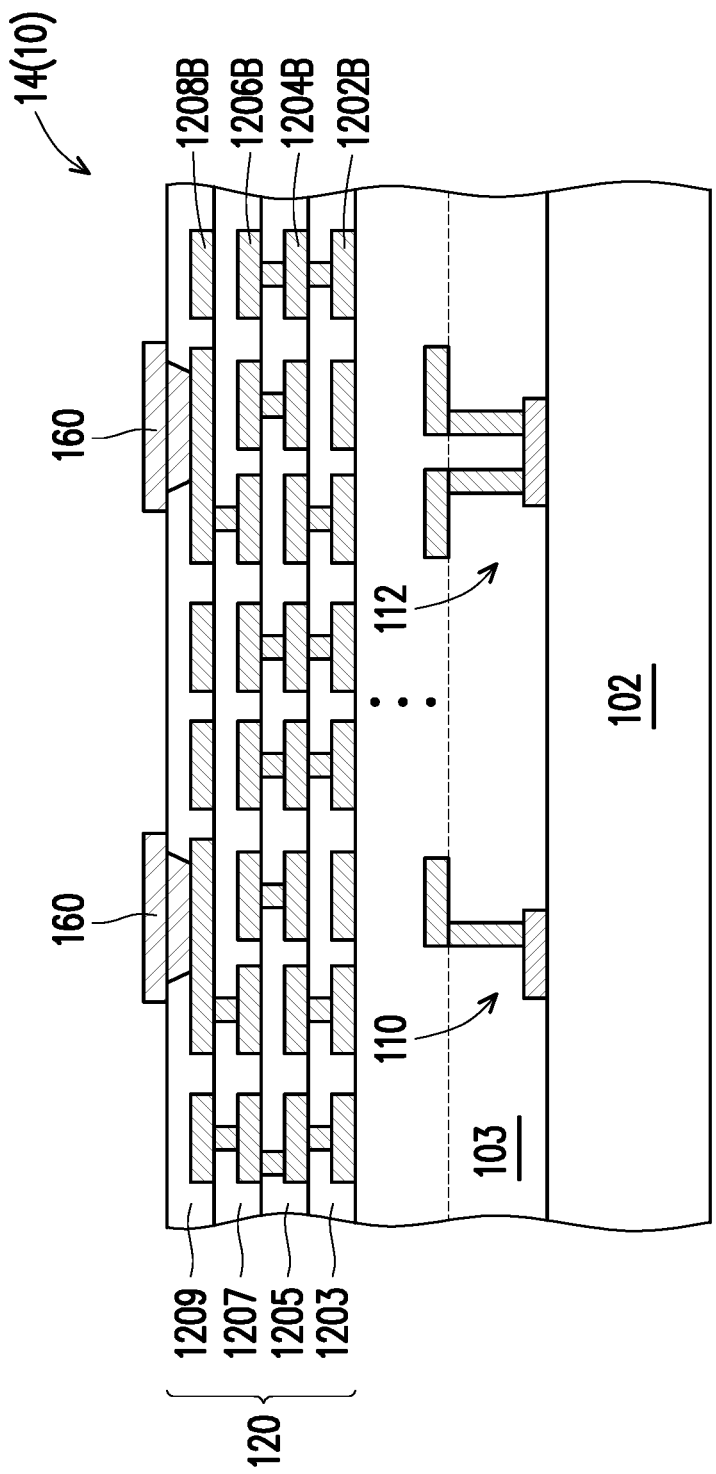

FIG. 1 illustrates a top view of an exemplary wafer structure with scribe streets in accordance with some embodiments of the present disclosure. FIG. 2 illustrates a top view of a portion of the wafer structure of FIG. 1 in accordance with some embodiments of the present disclosure. FIG. 3A & FIG. 3B illustrates cross-sectional views of portions of the wafer structure of FIG. 2 along the cross-sectional lines IT and II-II' in accordance with some embodiments of the present disclosure. Referring to FIG. 1 and FIG. 2, a semiconductor wafer 10 comprises a plurality of dies 12, and the adjacent dies 12 are separated from one another by scribe streets 14. That is, the scribe streets 14 are formed on the exterior sides of the dies 12 and the seal ring structures 130 and surround the seal ring structure 130. The seal ring structures 130 located between the dies 12 and the scribe streets 14 can be used as a protective wall for protecting the dies 12 from stress. During die singulation (i.e., wafer dicing), in some embodiments, the semiconductor wafer 10 is cut along the scribe streets 14 so as to separate the dies 12. In certain embodiments, the semiconductor wafer 10 is a semiconductor wafer made of silicon or other semiconductor materials, such as III-V semiconductor materials. In some embodiments, the die 12 includes multiple types of chips or more than one type of integrated circuits or electrical components. In some embodiments, in FIG. 2, the dies 12 surrounded by seal ring structures 130 are divided and separated from one another by the scribe streets extending in the X direction and the scribe streets extending in the Y direction. In FIG. 2, the die 12 is surrounded by the scribe streets 141, 142, 143 and 144. In some embodiments, the scribe streets 141 and 143 are X-direction extending scribe streets and the scribe streets 142 and 144 are Y-direction extending scribe streets. In some embodiments, the scribe street extending in the X direction, such as the scribe streets 141, 143, has a width Ws measuring from the seal ring structures 130 by the two opposite sides of the scribe street. The scribe streets extending in the X direction and the scribe streets extending in the Y direction shown in FIG. 2 are shown to have the same width Ws. In alternative embodiments, the scribe streets extending in the X direction and the scribe streets extending in the Y direction may have different widths. In FIG. 2, the joints or intersection of X-direction extending scribe streets and the Y-direction extending scribe streets defines cross-road sections Xs. In some embodiments, in FIG. 2, test line regions 15 are located within the areas of the scribe streets, and the test line regions 15 are arranged along the extending direction(s) of the scribe street(s). In certain embodiments, the test line regions 15 are located between the opposite seal ring structures 130 but are not in contact with the seal ring structures 130. In some embodiments, the test line regions 15 are strip-shaped regions having test pads 160 and test line sections 180 therein. When the semiconductor wafer 10 is diced along the scribe streets 141, 143, the test line regions 15 and the test pads 160 arranged thereon are to be diced or removed in the X direction. When the semiconductor wafer 10 is diced along the scribe streets 142, 144, the test line regions 15 and the test pads 160 arranged thereon are to be diced or removed in the Y direction. In one embodiment, the test line region 15 has one test pad 160 and one test line section 180. In some embodiments, no test pads 160 are placed in the cross-road sections Xs. In alternative embodiments, one or more test pads 160 are placed in the cross-road sections Xs. In some embodiments, the test pads 160 are pads of the same dimensions, In some embodiments, the test pads 160 are pads of the different dimensions or different shapes.

During the semiconductor manufacturing processes of the semiconductor wafer 10, semiconductor devices are fabricated during the front-end-of-line (FEOL) processes, and connection and interconnection structures are fabricated during the back-end-of-line (BEOL) processes.

In some embodiments, in FIG. 3A, the die 12 of the semiconductor wafer 10 includes semiconductor devices 104 formed on a semiconductor substrate 102. In some embodiments, the semiconductor substrate 102 may include elementary semiconductor materials or alloy semiconductor materials. In some embodiments, the semiconductor substrate 102 is a silicon-on-insulator (SOI) substrate or a germanium-on-insulator substrate. In some embodiments, the die 12 includes at least one chip.

In FIG. 3A, in certain embodiments, the die 12 includes the semiconductor devices 104 formed on the semiconductor substrate 102 of the semiconductor wafer 10 during the front-end-of-line (FEOL) processes. In exemplary embodiments, the semiconductor device 104 embedded in an insulation layer 103 includes a gate structure 105 and source/drain regions 106, located between the isolation structures 107. The semiconductor devices 104 shown in FIG. 3A are merely examples, and other devices may be formed in the first wafer 100. In some embodiments, the semiconductor devices 104 are N-type metal-oxide semiconductor (NMOS) devices and/or P-type metal-oxide semiconductor (PMOS) devices. In some embodiments, the semiconductor devices 104 are transistors, memories or power devices, or other devices such as capacitors, resistors, diodes, photo-diodes, sensors or fuses.

In FIG. 3A, in certain embodiments, the die 12 includes connection structures 108 formed over the semiconductor devices 104 and embedded within the insulation layer 103. In some embodiments, the insulation layer 103 includes one or more layers of dielectric layers. In some embodiments, a material of the insulation layer 103 includes silicon oxide, a spin-on dielectric material, a low-k dielectric material or a combination thereof. The formation of the insulation layer 103 includes performing one or more processes by chemical vapor deposition (CVD) or by spin-on, for example. In some embodiments, the connection structures 108 include metal lines, vias, contact plugs or the combinations thereof. In exemplary embodiments, the semiconductor devices 104 are electrically connected with the connection structures 108 or some of the semiconductor devices 104 are electrically interconnected through the connection structures 108.

In FIG. 3B, in some embodiments, the wafer 10 includes a test device 110 and a test circuit 112 formed on the semiconductor substrate 102 and in the scribe street regions during the front-end-of-line (FEOL) processes. In exemplary embodiments, the test device 110 and the test circuit 112 are embedded in the insulation layer 103. In some embodiments, the test device 110 and the test circuit 112 are formed together with the semiconductor devices 104 during the same manufacturing processes. Fri some embodiments, the test device 110 and the test circuit 112 may include discrete transistors, resistor structures and/or capacitor structures, depending on the properties or measurements to be measured.

In FIG. 3A and FIG. 3B, interconnection structures 120 are formed over the insulation layer 103 and the connection structures 108, and above the test device 110, test circuit 112 and the semiconductor devices 104. In exemplary embodiments, the interconnection structures 120 includes metallization features 1202A/B, 1204A/B, 1206A/B, 1208A/B embedded in dielectric layers 1203, 1205, 1207, 1209. In some embodiments, the metallization features 1202A, 1204A, 1206A, 1208A are located in the die regions (in the regions of the dies 12) and are located above the semiconductor devices 104. In exemplary embodiments, the semiconductor devices 104 may be electrically connected with the metallization features 1202A, 1204A, 1206A, and 1208A. In some embodiments, the metallization features 1202B, 1204B, 1206B, 1208B are located in the scribe street regions (in the regions of the scribe streets 14) and are located above the test device 110 and the test circuit 112. In exemplary embodiments, although not expressly shown in FIG. 2A, the test device 110 and the test circuit 112 are electrically connected with the metallization features 1202B, 1204B, 1206B, 1208B.

In certain embodiments, the materials of the metallization features 1202A/B, 1204A/B, 1206A/B, 1208A/B include aluminum (Al), aluminum alloy, copper (Cu), copper alloy, tungsten (W), or combinations thereof. The metallization features 1202A/B, 1204A/B, 1206A/B, 1208A/B shown herein are merely for illustrative purposes, and the metallization features 1202A/B, 1204A/B, 1206A/B, 1208A/B may include other configurations and may include one or more through vias and/or damascene structures. In some embodiments, the semiconductor wafer 10 uses the interconnection structures 120 for interconnecting devices or circuitry of the dies 12. In some embodiments, in FIG. 3A and FIG. 3B, the interconnection structures 120 include a number of copper layers (shown as four layers) separated by the dielectric layers 1203, 1205, 1207, 1209. In some embodiments, each of the dielectric layers 1203, 1205, 1207, 1209 includes one or more layers of dielectric layers. In some embodiments, materials of the dielectric layers 1203, 1205, 1207, 1209 include silicon oxide, spin-on dielectric materials, low-k dielectric materials or combinations thereof. The formation of the insulation layer 103 includes performing one or more processes by chemical vapor deposition (CVD) or by spin-on, for example. In some embodiments, the semiconductor wafer 10 includes low-k dielectric layers 1203, 1205, 1207, 1209. The formation of the interconnection structures 120 includes forming and patterning the dielectric layer, depositing the copper layer over the patterned dielectric layer, and removing the extra portion of the deposited copper layer repeatedly for several times. The overall process can be used to not only make the metal interconnects, but a dual damascene process can be used to make vias and other interlayer connections.

Referring to FIG. 3A and FIG. 3B, the semiconductor wafer 10 includes contact pads 150 located within the die regions and test pads 160 located within the scribe street regions. In some embodiments, the contact pads 150 located within the die regions and the test pads 160 located within the scribe street regions are formed together during the same manufacturing processes. In certain embodiments, the materials of the contact pads 150 and the test pads 160 include aluminum (Al), aluminum alloy or combinations thereof. In some embodiments, in FIG. 3A, the contact pads 150 are located directly on the top metallization feature 1208A and are isolated by the top dielectric layer 1209. In some embodiments, the contact pads 150 are electrically connected with the interconnection structures 120 and the underlying semiconductor devices 104. In exemplary embodiments, the contact pads 150 include one or more input/output (I/O) pads, bump pads or bond pads, for example.

In some embodiments, in FIG. 3B, the test pads 160 are located directly on the top metallization feature 1208B and are isolated by the top dielectric layer 1209 located therebetween. In some embodiments, the test pads 160 are electrically connected with the interconnection structures 120 and the underlying test device 110 or test circuit 112. In some embodiments, the test pads 160 include wafer acceptance testing (WAT) pads and/or optical critical dimension (OCD) pads. During wafer testing, the test pads 160 located on the scribe streets 14 are electrically coupled to an external terminal through probe needles for testing. The test pads 160 are selected to test different properties of the wafer, such as leakage current, breakdown voltage, threshold voltage and effective channel length, saturation current, gate oxide thickness, critical dimension, contact resistance and connections. In some embodiments, considering the strip-shaped test line regions 15 as defined in FIG. 2 having test pads 160 and test line sections 180 around the test pads 160, the metallization features 1202B, 1204B, 1206B, 1208B located in the scribe street regions may be regarded as the test line sections 180 underlying the test pads 160.

Figure 4:
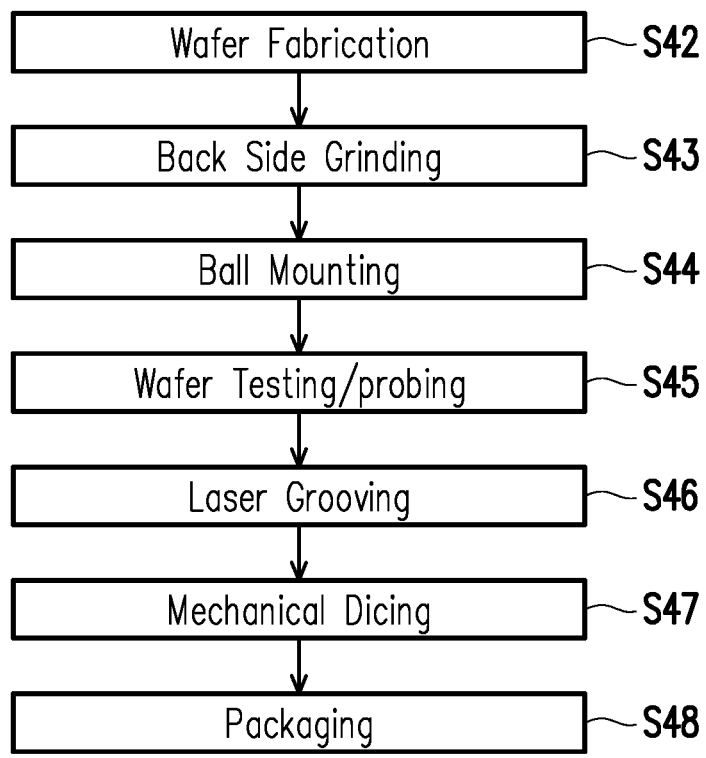
FIG. 4 is an exemplary flow chart showing the process steps of a packaging method in accordance with some embodiments of the present disclosure.
Figure 5A:
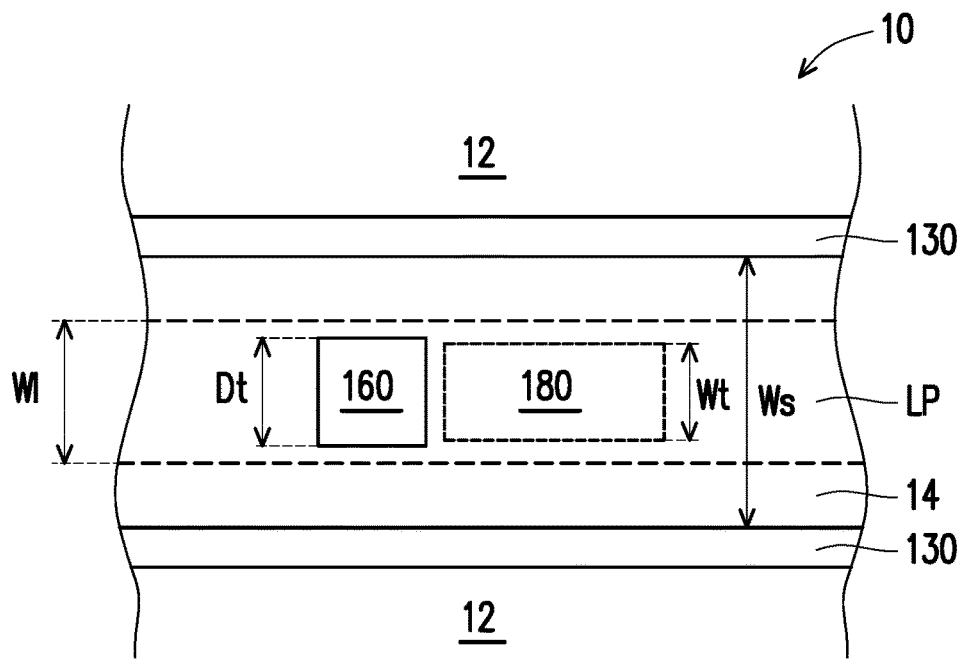
FIG. 5A is a schematic top view of a portion of the scribe street of the wafer structure before laser grooving in accordance with some embodiments of the present disclosure.

FIG. 4 is an exemplary flow chart showing the process steps of a packaging method in accordance with some embodiments of the present disclosure. Referring to FIG. 4 and FIGS. 5A-5C, in Step S42, the semiconductor wafer 10 is provided and subjected to various manufacturing processes, such as front-end-of-line (FEOL) processes and/or the back-end-of-line (BEOL) processes for wafer fabrication. In Step S43, a backside grinding process is performed to the semiconductor wafer 10. In Step S44, a ball mounting process is performed to mount solder bumps or solder balls onto the semiconductor wafer 10. In Step S45, the semiconductor wafer 10 is subjected to wafer testing (i.e. wafer probing) and wafer testing is performed through the test pad(s) 160 in the semiconductor wafer 10. In Step S46, a laser grooving process is performed to the semiconductor wafer 10 along the laser scanning paths LP (FIG. 5A). In Step S47, a mechanical dicing process is performed to the semiconductor wafer 10, cutting along the scribe streets 14 and singulating the dies 12. In Step S48, the singulated dies 12 are subjected to packaging processes into individual packages.

Figure 5B:
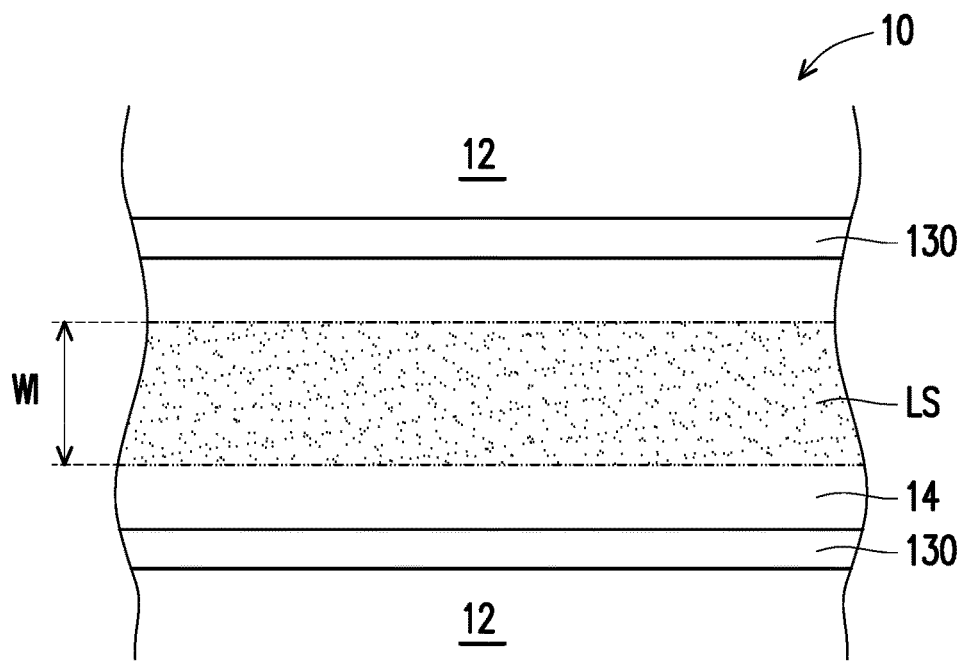
FIG. 5B is a schematic top view of a portion of the scribe street of the wafer structure after laser grooving in accordance with some embodiments of the present disclosure.
Figure 5C:
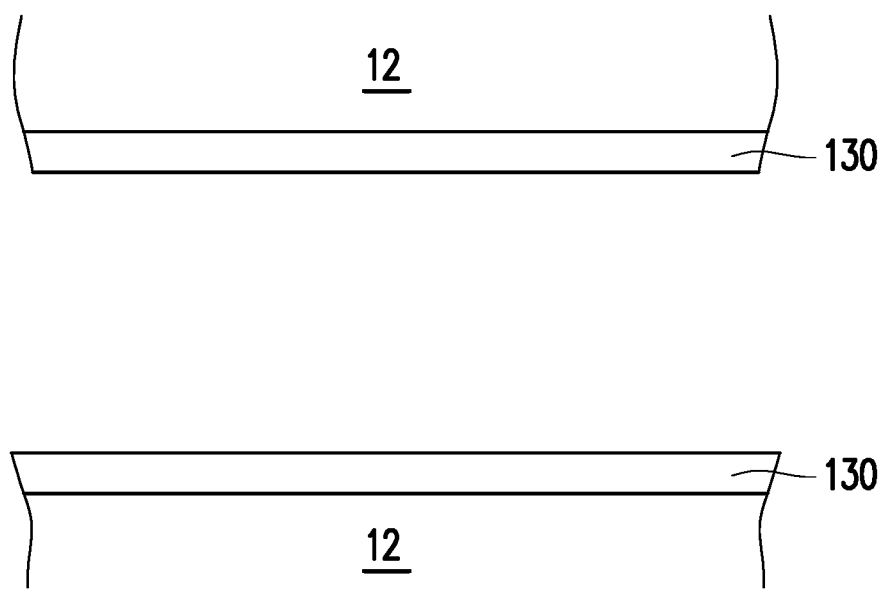
FIG. 5C is a schematic top view of a portion of the scribe street of the wafer structure after mechanical dicing in accordance with some embodiments of the present disclosure.

FIG. 5A is a schematic top view of a portion of the scribe street of the wafer structure before laser grooving in accordance with some embodiments of the present disclosure. FIG. 5B is a schematic top view of a portion of the scribe street of the wafer structure after laser grooving in accordance with some embodiments of the present disclosure. FIG. 5C is a schematic top view of a portion of the scribe street of the wafer structure after mechanical dicing in accordance with some embodiments of the present disclosure. In FIG. 5A, the scribe street 14 is defined as the region between the seal ring structures 130 outside the die regions, and the scribe street 14 has a width Ws (measuring in the Y direction, which is perpendicular to the extending direction X of the scribe street 14) of about 80 microns to about 90 microns, depending on the dimensions of the dies manufactured in the wafer. The seal ring structures 130 can protect the dies 12 from stress and prevent cracks generated during wafer sawing from propagating into the dies 12. In some embodiments, the seal ring structure 130 has a width of about 3-10 microns. In some embodiments, the test pad 160 located on the scribe street 14 is shown to be a square test pad having a dimension Dt of about 40 microns to about 45 microns. In some embodiments, the width Ws of the scribe street 14 is about 80 microns, and the dimension Dt is about 40 microns. In some embodiments, the dimension Dt of the test pad 160 is at most about half of the width Ws of the scribe street 14. In some embodiments, the dimension of one or some of the test pads 160 is less than half of the width Ws of the scribe street 14. In alternative embodiments, the test pad 160 may be rectangular or tetragonal shaped, depending on the layout design of test pads.

In some embodiments, the wafer dicing processes of the semiconductor wafer 10 includes a laser grooving process and a mechanical dicing process. In some embodiments, during the laser grooving process of the wafer dicing processes, a laser beam is applied to the semiconductor wafer 10 to form indented grooves with a predetermined depth in the regions of the scribe streets 14 without cutting through the semiconductor wafer 10. In FIG. 5A, the predetermined scanning region or the scanning path of the laser (laser scanning path) LP is shown in dotted lines. In some embodiments, each scribe street has one laser scanning path LP and the laser scanning path LP is narrower in width than the scribe street therein. In some embodiments, the test pad(s) 160 is arranged to be located within the span of the laser scanning path LP. In certain embodiments, the entire test pad 160 is located within the span of the laser scanning path LP. In certain embodiments, none of the test pads 160 are located outside the spans of the laser scanning paths LP. In some embodiments, the laser scanning path LP extends in the extending direction of the scribe street therein and is arranged to be substantially parallel to the scribe street therein. In certain embodiments, the laser scanning path has a width W1 (in the Y direction) of about 40 microns to about 50 microns. In some embodiments, the width W1 of the laser scanning path LP is larger than the dimension Dt of the test pad 160. In certain embodiments, the dimension Dt of the test pad 160 is at most about 75%~95% of the width W1 of the laser scanning path LP. In some embodiments, the dimension Dt of the test pad 160 is at most about 85%-90% of the width W1 of the laser scanning path LP. In some embodiments, the dimension Dt of the test pad 160 is about or smaller than 85% of the width W1 of the laser scanning path LP. In some embodiments, the width W1 of the laser scanning path LP is set to be about 47 microns, while the dimension Dt of the test pad 160 is about 40 microns. That is, the test pad(s) 160 arranged on the laser scanning path LP is intended to be completely removed during the laser scanning or laser grooving process. In alternative embodiments, the test pad 160 is rectangular shaped, the width of the test pad 160 (measuring in the direction perpendicular to the extending direction of the scribe street) is designed to be smaller than the width W1 of the laser scanning path LP. Similarly, the test line section(s) 180 is arranged to be located within the span of the laser scanning path LP and the underlying test line section 180 is designed to have a width Wt substantially equivalent to or smaller than the dimension Dt of the test pad 160, and smaller than the width W1 of the laser scanning path LP. During the laser scanning/laser grooving, the semiconductor wafer 10 is laser grooved (the materials of the semiconductor wafer 10 are removed by the laser to form grooves) along the laser scanning path LP and the test pad(s) 160 arranged on the laser scanning path LP as well as the underlying test line section(s) 180 in the laser scanning path LP are removed by laser. In one embodiment, the laser grooving process is performed with an infrared laser such as an Nd-YAG (neodymium-doped yttrium aluminum garnet) laser with a laser power 1.0-1.5 W each pass. In some embodiments, the laser grooving process includes using a laser with a laser power strong enough to remove all of the test pads 160 in the scribe streets. Depending on the grooving depth caused by laser grooving, some or almost all of the underlying test line section(s) 180 are removed by laser. After performing the laser grooving process to the wafer 10, a lase scanned region(s) LS is formed and the test pad(s) 160 arranged on the laser scanning path(s) LP are completely removed, so that no test pad is remained in the lase scanned region(s) LS as shown in FIG. 5B. In certain embodiments, the laser scanned regions LS have no remainders of the test pads 160 after performing the laser grooving process. Since no or little metal material is remained in the scribe street region(s) after the laser scanning, the scribe street regions are relieved from damages, such as peeling, delamination, or dielectric fracture, which are often induced by the remainder of the metal material(s) that has a high thermal expansion coefficient and may introduce internal stress in the regions of the scribe streets.

Subsequently, the mechanical dicing process, as part of the wafer dicing process, is performed to the semiconductor wafer 10. In one embodiment, the mechanical dicing process includes a mechanical blade dicing step using a diamond embedded blade (not shown) to cut through the semiconductor wafer 10 along the scribe streets 14 to separate the dies 12 (i.e. singulating the dies 12). In some embodiments, as shown in FIG. 5C, after performing the mechanical dicing process, the dies 12 of the semiconductor wafer 10 are separate and singulated.

The singulated dies 12 may be additional processed or packaged in the subsequent processes, and these subsequent processes may be modified based on the product design and will not be described in details herein.

Figure 6:
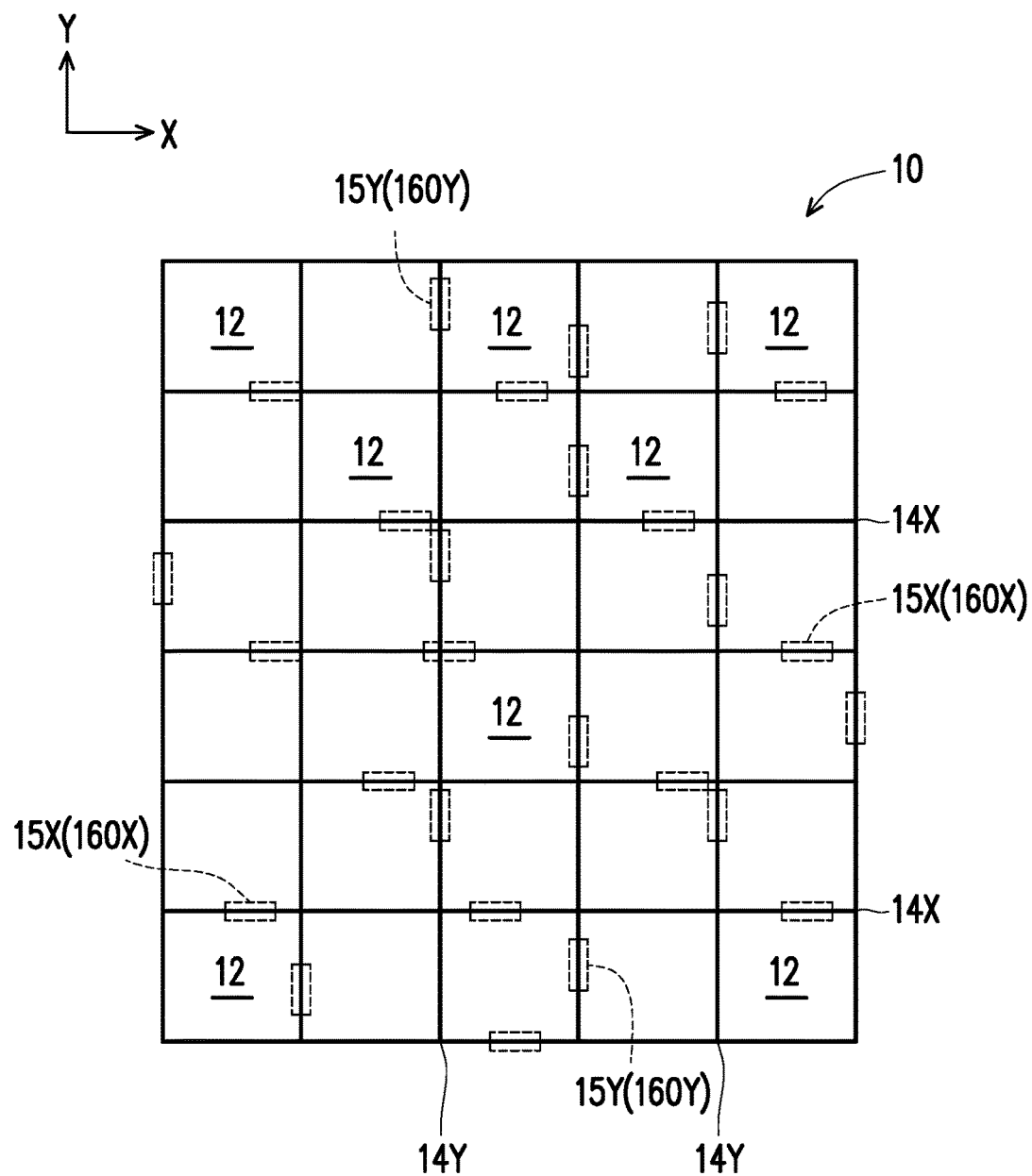
FIG. 6 is a schematic layout of the locations of the test pads on of the scribe streets of the wafer structure in accordance with some embodiments of the present disclosure.

FIG. 6 is a schematic layout of the locations of the test pads on of the scribe streets of the wafer structure in accordance with some embodiments of the present disclosure. In FIG. 6, a number of the dies 12, which is part of the semiconductor wafer 10, are enclosed by scribe streets 14X extending in the X direction and scribe streets 14Y extending in the Y direction. Each test line region is exemplified in this embodiment to have one test pad and one test line section therein. In some embodiments, the test line regions 15X including test pads 160X are arranged on the X-direction scribe streets 14X, and the test line regions 15Y including test pads 160Y are arranged on the Y-direction scribe streets 14Y. As shown in FIG. 6, in exemplary embodiments, fourteen test line regions 15X and thirteen test line regions 15Y are respectively arranged on the scribe streets 14X and the scribe streets 14Y surrounding thirty dies 12. In some embodiments, no more than one test line region is arranged on the scribe street at one side of one die 12. In some embodiments, for one die 12 (the topmost leftmost die 12 as shown in FIG. 6), at least the scribe street at one of the four sides of the same die 12 has one test line region therein. In some embodiments, for one die 12 (the topmost middle die 12 as shown in FIG. 6), at most three test line regions are respectively arranged on the scribe streets at three of the four sides of the same die 12. In some embodiments, for one die 12 (the topmost rightmost die 12 as shown in FIG. 6), two test line regions are respectively arranged on the scribe streets at two of the four sides of the same die 12. In some embodiments, the distribution of the locations of the test line region (i.e. the test pads) is designed to be uniform in either X direction or Y direction. In certain embodiments, the number of the test pads (or test line regions) in the Y direction may be slightly less than or approaches the number of the test pads (or test line regions) in the X direction. In one embodiment, a ratio of the number of the Y-direction test pads to the number of the X-direction test pads is about 85%-115% or 85%-100%. In some alternative embodiments, at most two test line regions may be arranged on the scribe street at one side of one die 12. In alternative embodiments, when more than one test pads are included in the test line region(s), the test pads may be spaced apart, and may be spaced apart in equal distances.

Figure 8:
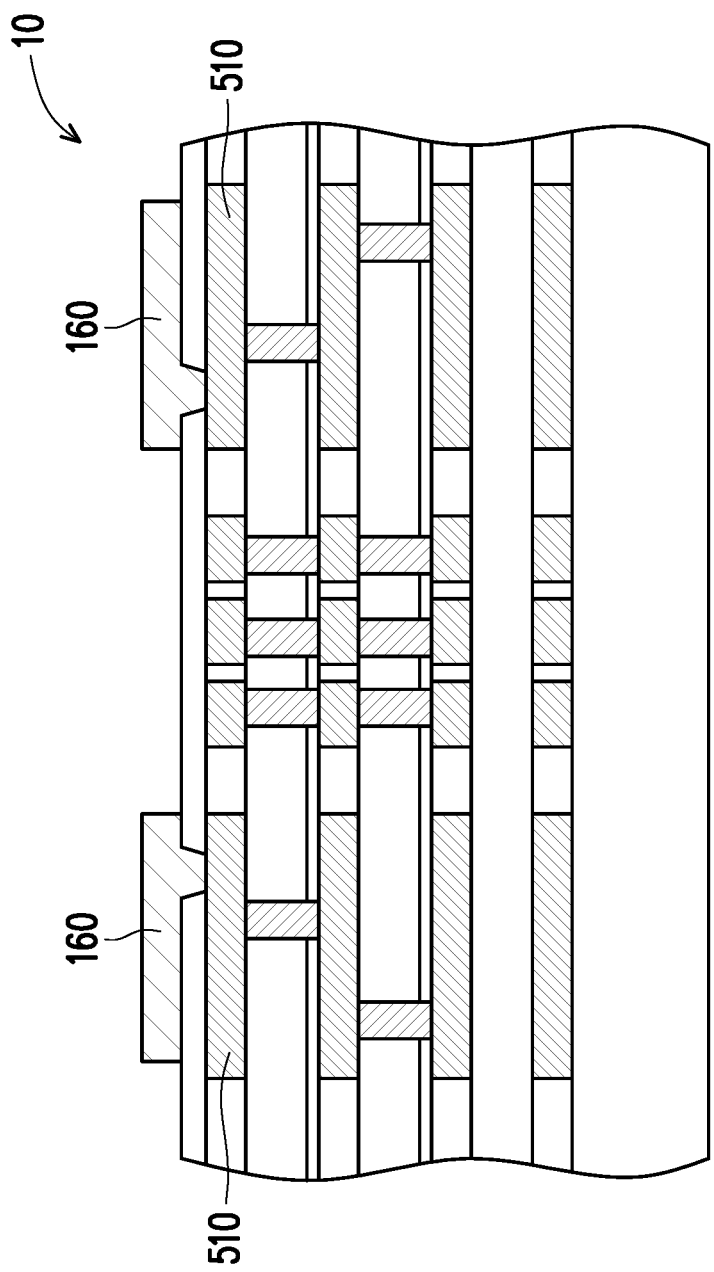
FIG. 8 is a schematic cross-sectional view showing test pads in the wafer structure in accordance with some embodiments of the present disclosure.

FIG. 8 is a schematic cross-sectional view showing test pads in the wafer structure in accordance with some embodiments of the present disclosure. In FIG. 8, in some embodiments, the test pads 160 are disposed directly on the top metallization features 510 and are vertically aligned with the top metallization features 510. In exemplary embodiments, the locations of the test pads 160 correspond to and line up with the locations of the top metallization features 510. In certain embodiments, the distribution of the top metallization features 510 (as well as the underlying metallization features) correspond to the distribution of the test pads 160.

Figure 7:
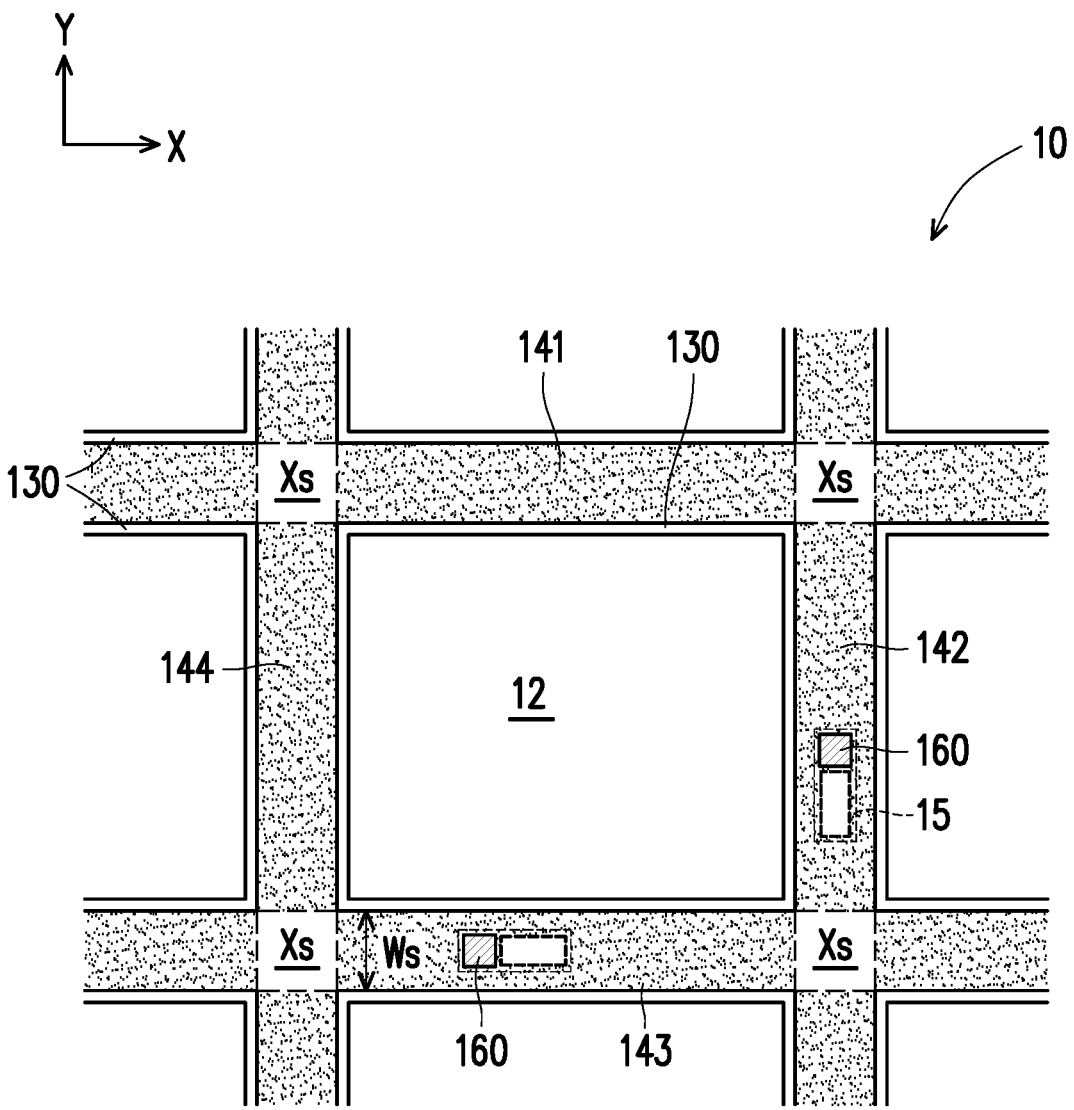
FIG. 7 is a schematic top view showing the relative areas of the scribe street and the test pad in accordance with some embodiments of the present disclosure.

FIG. 7 is a schematic top view showing the relative areas of the scribe street and the test pad in accordance with some embodiments of the present disclosure. In FIG. 7, the areas of the scribe streets 141-144 are shown as the dotted shaded regions, while the areas of the test pads 160 are shown as the cross-lined regions. The test pad pattern density is defined as the ratio of the test pad area (i.e. the total area of all the test pads therein) to the scribe street area (i.e. the area of the whole scribe street) where such test pad is located thereon, for each scribe street around each die. In FIG. 7, for the scribe streets 141 and 144 of the die 12, the test pad pattern density is zero as there is no test pad located in the scribe streets 141 and 144. In FIG. 7, for the scribe streets 142 and 143 of the die 12, the test pad pattern density is below 25%. In some embodiments, the principle for the arrangement of the test pads is set to have the test pad pattern density of the scribe street at most equivalent to or less than 25%. In some embodiments, the test pad pattern density of the scribe street(s) around each die (either in X direction or in Y direction) is below 25%. In some embodiments, the test pad pattern density of the scribe street(s) around each die may be as low as 16%. As long as the test pad pattern density is kept within a specific range, such as, no more than 25%, low laser power is enough for the laser grooving process to remove the test pads and the related test line sections arranged on the laser scanning path.

When considering a design rule for the placement of test pads on the scribe streets, it is important to consider reducing the stress caused during wafer dicing. In the exemplary embodiments, the test pads are arranged on the scribe streets in smaller sizes (e.g. smaller or narrower than the laser scanning path) and in a more uniform way. In the exemplary embodiments, the test pads are arranged on the scribe streets in a more uniform way and with lower pattern densities. During the wafer dicing process, the applied laser grooving process with a lower laser power is effective enough to remove substantially all of the test pads. This results in better reliability of the devices and leads to obtaining dies having more robust structures, as no or less delamination between the multiple layers at the die is induced by the lower laser power.

In general, individual unpackaged dies are inspected and then transferred to tape reels and rolled (tape and reel) prior to shipping. In the exemplary embodiments, the singulated dies are obtained from the semiconductor wafer going through the laser grooving process of the wafer dicing process as described in the above embodiments. In some embodiments, the obtained singulated dies are subjected to bare reel drop tests to evaluate the structural robustness of the singulated dies. In certain embodiments, in the bare reel drop test, the dies wrapped in the tape reel are subjected to four cycles of drops, for each cycle the reel is downside dropped and upside dropped, from the height of two meters and then inspected by infrared detection to check the structural integrity. Herein, the reel being downside dropped means that the reel is dropped with the sprocket hole of the reel facing downward and the reel planar surface parallel to the ground, while the reel being upside dropped means that the reel is dropped with the sprocket hole of the reel facing upward and the reel planar surface parallel to the ground. It is shown that the fail rate of the dies subjected to the bare reel drop test (i.e. structural damage of the die through the bare reel drop test) can be as low as one out of 100 dies (1%), which is about fourth of the fail rate for the dies fabricated from the conventional semiconductor wafer.

In the above embodiments, as the test pads are arranged on the scribe streets in smaller sizes, the test pads or test lines are easily removed without remainders during dicing, thus leading to less chipping and delamination and a more robust structure of the die. In some embodiments, since the test pads are arranged on the scribe streets with low pattern densities, less energy or less laser power is needed for removing the test pads, which results in improved electrical performance and better reliability of the semiconductor device of the chips.

In some embodiments of the present disclosure, a packaging method is described. A semiconductor wafer having dies and first scribe streets and second scribe streets surrounding the dies is provided. The first scribe streets extend in a first direction and the second scribe streets extend in a second direction, and the first direction is perpendicular to the second direction. First test pads are formed in the first scribe streets with a first test pad pattern density no more than 25%. The first test pad pattern density is a ratio of a total area of the first test pads to an area of one first scribe street where the first test pads formed therein. Second test pad are formed in the second scribe streets with a second test pad pattern density no more than 25%. The second test pad pattern density is a ratio of a total area of the second test pads to an area of one second scribe street where the second test pads formed therein. Wafer testing is performed to the semiconductor wafer through the first and second test pads. A laser grooving process is performed to the semiconductor wafer along the first and second scribe streets and the first and second test pads in the first and second scribe streets are removed to form laser scanned regions in the first and second scribe streets. A mechanical dicing process is performed cutting through the semiconductor wafer along the first and second scribe streets to singulate the dies. The singulated dies are packaged.

In some embodiments of the present disclosure, a wafer structure is described. The wafer structure comprising a plurality of dies, scribe streets and test pads. Each of the plurality of dies is surrounded by a seal ring structure. The scribe streets are located outside of the plurality of dies and the seal ring structures and surround the plurality of dies and the seal ring structures. Each scribe street has a laser scanning path therein, and the laser scanning path is substantially parallel to the scribe street therein and extends in an extending direction of the scribe street therein. The test pads are disposed in the scribe streets and on the laser scanning paths. Each test pad has a first width measuring in a direction perpendicular to the extending direction of the scribe street therein, and the first width is smaller than a second width of the laser scanning path in the scribe street therein.

In some embodiments of the present disclosure, a packaging method is described. A semiconductor wafer having dies, scribe streets surrounding the dies and between the dies and test pads in the scribe streets is provided. Wafer testing is performed to the semiconductor wafer through the test pads. A laser grooving process is performed to the semiconductor wafer along the scribe streets and the test pads in the scribe streets are removed to form laser scanned regions in the scribe streets. A mechanical dicing process is performed cutting through the semiconductor wafer along the scribe streets to singulate the dies. The singulated dies are then packaged.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaging method, comprising:
providing a semiconductor wafer having dies, scribe streets surrounding the dies and between the dies and test pads in the scribe streets;
performing wafer testing to the semiconductor wafer through the test pads;
performing a laser grooving process to the semiconductor wafer along the scribe streets and removing the test pads in the scribe streets to form laser scanned regions in the scribe streets;
performing a mechanical dicing process removing an entirety of the laser scanned regions and cutting through the semiconductor wafer along the scribe streets to singulate the dies; and
packaging the singulated dies.

2. The method of claim 1, wherein the laser grooving process is performed by irradiating an infrared laser removing the test pads.

3. The method of claim 1, wherein performing the laser grooving process includes using a laser with a laser power enough to remove the test pads in the scribe streets.

4. The method of claim 3, wherein the laser scanned regions have no remainders of the test pads after performing the laser grooving process.

5. The method of claim 1, further comprising performing a backside grinding process to the semiconductor wafer before performing wafer testing.

6. A packaging method, comprising:
providing a semiconductor wafer having dies and first scribe streets and second scribe streets surrounding the dies, wherein the first scribe streets extend in a first direction and the second scribe streets extend in a second direction, and the first direction is perpendicular to the second direction;
forming first test pads in the first scribe streets with a first test pad pattern density no more than 25%, wherein the first test pad pattern density is a ratio of a total area of the first test pads to an area of one first scribe street where the first test pads formed therein;
forming second test pad in the second scribe streets with a second test pad pattern density no more than 25%, wherein the second test pad pattern density is a ratio of a total area of the second test pads to an area of one second scribe street where the second test pads formed therein;
performing wafer testing to the semiconductor wafer through the first and second test pads;
performing a laser grooving process to the semiconductor wafer along the first and second scribe streets and removing the first and second test pads in the first and second scribe streets to form laser scanned regions in the first and second scribe streets;
performing a mechanical dicing process removing an entirety of the laser scanned regions and cutting through the semiconductor wafer along the first and second scribe streets to singulate the dies; and
packaging the singulated dies.

7. The method of claim 6, wherein each of the dies is surrounded by two first scribe streets and two second scribe streets, and at least one scribe street of the two first scribe streets and the two second scribe streets has one test pad therein.

8. The method of claim 7, wherein two test pads are respectively formed in two scribe streets of the two first scribe streets and the two second scribe streets for one of the dies.

9. The method of claim 7, wherein three test pads are respectively formed in three scribe streets of the two first scribe streets and the two second scribe streets for one of the plurality of dies.

10. The method of claim 6, wherein the first test pad pattern density is no more than 16%.

11. The method of claim 6, wherein the second test pad pattern density is no more than 16%.

12. The method of claim 6, wherein the laser scanned regions have no remainders of the test pads after performing the laser grooving process.

13. A semiconductor structure, comprising:
a plurality of dies, wherein each of the plurality of dies is surrounded by a seal ring structure;
scribe streets, located outside of the plurality of dies and the seal ring structures and surrounding the plurality of dies and the seal ring structures, wherein each scribe street has a laser scanning path therein and the laser scanning path is substantially parallel to the scribe street therein and extends in an extending direction of the scribe street therein;
test pads, disposed in the scribe streets and on the laser scanning paths, wherein each test pad has a first width measuring in a direction perpendicular to the extending direction of the scribe street therein, and the first width is smaller than a second width of the laser scanning path in the scribe street therein; and
test line sections, disposed in the scribe streets and on the laser scanning paths, wherein the test line sections are located beneath and separate from the test pads, each test line section has a third width measuring in the direction perpendicular to the extending direction of the scribe street therein, and the third width is smaller than the second width of the laser scanning path in the scribe street therein.

14. The structure of claim 13, wherein the first width of the test pad is about 40 microns to about 45 microns, and the second width of the laser scanning path is about 40 microns to about 50 microns.

15. The structure of claim 13, wherein the first width of the test pad is about 40 microns, and the second width of the laser scanning path is about 47 microns.

16. The structure of claim 13, wherein the first width of the test pad is about 85% to about 90% of the second width of the laser scanning path.

17. The structure of claim 13, wherein each test pad is located within a span of the laser scanning path, each test line section is located within the span of the laser scanning path and the third width is smaller than the first width.

18. The structure of claim 13, wherein each of the plurality of dies is surrounded by four scribe streets, and at least one scribe street of the four scribe streets has one test pad therein.

19. The structure of claim 13, wherein each scribe street has a test pad pattern density no more than 25%, and the test pad pattern density is a ratio of a test pad area to a scribe street area for each one scribe street.

20. The structure of claim 13, wherein each scribe street has a test pad pattern density no more than 16%, and the test pad pattern density is a ratio of a test pad area to a scribe street area for each one scribe street.

* * * * *